United States Patent
Li et al.

(10) Patent No.: US 7,138,841 B1
(45) Date of Patent: Nov. 21, 2006

(54) PROGRAMMABLE PHASE SHIFT AND DUTY CYCLE CORRECTION CIRCUIT AND METHOD

(75) Inventors: Gabriel Li, San Francisco, CA (US); Chwei-Po Chew, Cupertino, CA (US); Dusan Vecera, Los Gatos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 47 days.

(21) Appl. No.: 11/014,578

(22) Filed: Dec. 16, 2004

Related U.S. Application Data

(60) Provisional application No. 60/532,052, filed on Dec. 23, 2003.

(51) Int. Cl.
*H03K 3/017* (2006.01)
(52) U.S. Cl. ...................... 327/175; 327/176
(58) Field of Classification Search ................ 327/159, 327/160, 172–176, 233, 234, 156
See application file for complete search history.

(56) References Cited

U.S. PATENT DOCUMENTS

| | | | |
|---|---|---|---|
| 4,843,255 A | 6/1989 | Stuebing | 556/406 |
| 4,890,065 A | 12/1989 | Laletin | 327/233 |
| 5,124,597 A | 6/1992 | Stuebing et al. | 327/261 |
| 5,315,164 A | 5/1994 | Broughton | 327/175 |
| 5,410,191 A | 4/1995 | Miura | 327/227 |
| 5,563,605 A | 10/1996 | McEwan | 342/202 |
| 5,682,114 A | 10/1997 | Ohta | 327/276 |
| 5,933,039 A | 8/1999 | Hui et al. | 327/262 |
| 5,959,479 A * | 9/1999 | Woodward | 327/160 |
| 6,055,287 A | 4/2000 | McEwan | 375/376 |
| 6,060,922 A | 5/2000 | Chow et al. | 327/175 |
| 6,762,634 B1 * | 7/2004 | Hattori | 327/159 |
| 2003/0151453 A1 | 8/2003 | Laletin | 327/551 |

OTHER PUBLICATIONS

Efendovich et al., "Multifrequency Zero-Jitter Delay-Locked Loop," IEEE Journal of Solid-State Circuits, vol. 29, No. 1, Jan. 1994, pp. 67-70.

* cited by examiner

*Primary Examiner*—Linh My Nguyen
(74) *Attorney, Agent, or Firm*—Kevin L. Daffer; Daffer McDaniel, LLP

(57) ABSTRACT

A phase shift and duty cycle correction circuit is disclosed herein as comprising a programmable digital to analog converter (DAC), a storage device (e.g., a capacitor), a charge sub-circuit and dump sub-circuit for charging and discharging the storage device, respectively, a comparator, and a clock driver circuit. A linearly increasing (or ramped) voltage waveform is generated within the storage device by the charging and discharging actions of the charge and dump sub-circuits; a periodic process which is controlled by opposite phases of the input clock. By programming the DAC control input to change the slicing threshold of the ramped waveform, the circuit and method described herein provides a means for programmable phase shifting and duty cycle correction.

25 Claims, 3 Drawing Sheets

PROGRAMMABLE PHASE SHIFT AND DUTY CYCLE CORRECTION CIRCUIT AND METHOD

PRIORITY APPLICATION

This application claims priority to provisional application No. 60/532,052 filed Dec. 23, 2003 entitled "Programmable Clock Phase Shifter and Duty Cycle Correction Scheme."

BACKGROUND OF THE INVENTION

1. Field of the Invention

The present invention relates generally to electronic circuits, and in particular, to phase shift and duty cycle correction in clock generation circuits.

2. Description of the Related Art

The following descriptions and examples are given as background only.

Many electronic systems include one or more synchronous components that rely on receiving related signals at substantially the same time to maintain proper operating characteristics of the electronic system. A computer system is one example of a synchronous system that may include a multitude of interrelated system components, each designed to perform a particular operation in response to a clock signal. In some cases, data transfer between system components may be synchronized by one or more clock signals originating from a common source. The system components may receive the clock signals through a clocking network, which may include clock generation and distribution circuits.

In some cases, clock generation may be accomplished by manipulating the output of a source, such as a crystal oscillator, to generate a plurality of clock signals in accordance with the needs of various components within the computer system. The generated clock signals may be fanned out to the system components via a clock distribution network. In an ideal situation, the generated clock signals may be received by each of the system components at substantially the same time. In practice, however, timing delays and uncertainties of clock signal generation and distribution may cause one or more system components to receive clock signals at slightly different instances. In some cases, even the smallest variation in the arrival of a clock signal transition relative to a data signal transition may significantly impact system performance and/or reliability. For this reason, good clock distribution tends to be very important in the overall performance and reliability of electronic systems. Unwanted clock skew and jitter are two phenomena that may result from poor clock distribution, thus causing problems in the design and operation of the electronic systems.

As used herein, the term "skew" may be described as a variation in the arrival times of two related signals, which are specified to arrive at the same time. For example, "clock skew" may occur when an active "transition" or "edge" of the clock signal "lags" (i.e., arrives sometime after) or "leads" (i.e., arrives sometime before) the data signal transition(s) received by a system component. Clock skew may be introduced into a clocking network through load mismatches, routing parasitics (i.e., interlayer dielectric thickness, interconnect thickness and channel length mismatches), and/or variations in temperature, voltage, and process (i.e., trace conductor length, width, and composition mismatches, capacitive loading, etc.).

Unfortunately, clock skew may adversely affect the timing margins of one or more components within a synchronous system. For example, it is often necessary to properly align the clock signal to the data being sampled at the input latches of a system component to achieve synchronous operation. Such alignment may ensure that the data transition occurs at the proper moment between the edges or active transitions of the clock signal. Synchronous systems, therefore, generally rely on data transitioning and remaining stable from a time, which occurs at least a "setup time" before the clock transition, until at least a "hold time" after the clock transition. Most synchronous system components have stringent setup and hold timing requirements, which are typically specified by a manufacturer of the system component.

As operating speeds increase, the setup and hold timing margins between active transitions of the clock and data signals are reduced, thereby decreasing the window within which a data transition can be successfully latched by a clock transition. For example, edge-sensitive flip-flops may be used for sampling data signals received by a system component. In such an example, a flip-flop may successfully latch a data signal if the data signal is stable during the critical setup and hold periods on either side of the clock transition. However, if clock skew occurs, it may shift the clock transition sufficiently in time to cause a bit error when the data is sampled. As described herein, a "bit error" is a sampling error that occurs when a data signal is incorrectly sampled by a clock transition.

Jitter, on the other hand, generally results from time-varying components of noise sources, and is often defined as the cycle-to-cycle variation in the threshold crossings of a data signal. In other words, jitter may occur in data samples taken near, but not exactly at, the desired sample locations of an individual data signal, such that a sample is temporally displaced by an unknown, though usually small interval (e.g., an interval substantially less than or equal to one clock cycle). Unfortunately, jitter may cause the data signal to be shifted sufficiently in time to produce a bit error when the data signal is incorrectly sampled by the clock signal.

Techniques have been developed to minimize the effects of timing delays, such as clock skew and jitter, which degrade the performance and reliability of synchronous systems. However, most currently used techniques cannot guarantee that a data signal transition will occur at the critical moment between clock signal edges in all conditions. For example, some techniques utilize phase locked loops (PLLs) or delay-locked loops (DLLs) for adding a somewhat variable, though highly consistent amount of delay to a clock path. The added delay may be used to adjust the active edge of a clock signal before it is used for sampling a data signal. As such, a PLL or DLL device could be used to reduce clock skew by adjusting the timing of the clock signal, so that it occurs within the data setup and hold time requirements of a system component. However, the timing delays generated by typical PLL and DLL devices may fail to overcome clock skew in some applications.

Generally speaking, PLLs are closed-loop devices that utilize voltage-controlled oscillators (VCOs) for obtaining accurate phase and frequency alignment between two signals, typically referred to as feedback and reference signals. Though similar, a DLL device generally differs from a PLL device in that it uses a delay line, instead of a VCO, for obtaining accurate phase and frequency alignment between the feedback and reference signals. The VCO of a PLL and the delay line of a DLL may each be used for generating one or more phases, depending on the number of stages included within the VCO or delay line. In some cases, a particular phase may be selected for shifting a transition of a clock signal relative to a data signal transition. In this manner, a PLL or DLL may be used within a phase shift apparatus to provide a somewhat variable, although highly consistent, amount of phase delay by which to shift a clock signal transition.

Conventional phase shift apparatuses often include circuitry for selecting one of the phases output from a PLL or DLL device, or in other words, for "phase picking" from a multi-phase voltage controlled oscillator (VCO) or delay line (DL). A conventional delay locked loop (DLL) is shown in FIG. 1. As illustrated, DLL 100 includes phase frequency detector (PFD) 110, charge pump (CP) 120, loop filter 130 and multi-phase delay line 140. In operation, PFD 110 may compare the phase of the feedback signal ($\phi_{OUT}$) to the phase of the reference signal ($\phi_{REF}$) and generate corrective "up" and "down" pulses in response thereto. Next, charge pump 120 may compare the durations of the corrective "up" and "down" pulses and generate a net voltage value ($V_{UP/DN}$), representing an error signal or phase correction signal. Loop filter 130 may then filter the error signal and adjust the delay of multi-phase delay line 140 by supplying a differential control input ($V_{con+/-}$) thereto. When supplied to delay line 140, the differential control input may be used to produce a plurality of phase increments (e.g., $\phi_1, \ldots \phi_5$), depending on the number of stages included within the multi-phase delay line.

Though five phase increments are shown in FIG. 1, additional phase increments may be provided by increasing the number of stages within the delay line (e.g., a DLL circuit described in the IEEE Journal of Solid State Circuits, vol. 29, p. 67, January 1994 illustrates a delay line with 128 stages). To facilitate "phase picking", a first multiplexor 150 may be included within DLL 100 for selecting one of the phases (e.g., $\phi_1, \ldots \phi_5$) to be output from the DLL ($\phi_{OUT}$) and sent back to the PFD as feedback signal ($\phi_{FB}$). In some cases, phase selection from multiplexor 150 may be controlled via a second multiplexor 160 and/or an external selection signal (SEL). The external selection signal may be obtained from an external circuit (not shown) configured for selecting an appropriate clock phase.

The incremental phase delay, or phase resolution, provided by PLL and DLL devices is inversely proportional to the number of stages, N, included within the oscillator or delay line. Unfortunately, the number of stages allowed within an oscillator or delay line is usually limited by the maximum operating frequency, $F_{MAX}$, of the PLL or DLL. For example, the phase resolution of a PLL or DLL may be approximately equal to $1/(2*F_{MAX}*N)$, or the minimum delay of one stage, which in current technology may range between about 50–150 picoseconds. As mentioned above, however, the window within which a data transition can be successfully latched by a clock transition decreases as the operating speeds of synchronous systems increase. Therefore, PLL and DLL devices may not provide sufficient phase resolution for accurately controlling timing delays within high-speed synchronous systems. For example, the number of phases output from a PLL or DLL may be limited to about 3–5 as frequency levels increase, thereby limiting the output phase resolution to about ⅓ to ⅕ of the clock period.

In addition to insufficient phase resolution (i.e., large phase increments), PLL/DLL-based phase shift apparatuses generally suffer from limited frequency range and loop stability issues. As a further disadvantage, phase shift apparatuses employing PLLs or DLLs often fail to provide a means for correcting or modifying the duty cycle of the generated output signal. It would, therefore, be desirable to provide an improved phase shift and duty cycle correction circuit and method that does not suffer from the disadvantages of the conventional solution.

SUMMARY OF THE INVENTION

The problems outlined above may be in large part addressed by an improved phase shift and duty cycle correction circuit and method, which overcomes the disadvantages of conventional phase shift circuits by providing programmable phase alignment and duty cycle correction. Further advantages of the improved circuit include frequency independent, open loop operation in a compact circuit design, which may be implemented in MOS or bipolar technology. When incorporated within a synchronous system, the phase shift and duty cycle correction circuit described herein can be used to provide an improved data/clock interface by adjusting clock transitions in relation to the data transitions. Additional advantages may become apparent in light of the following disclosure. According to one embodiment, the programmable clock phase shift and duty cycle correction scheme described herein may be used, e.g., in spread spectrum modulation phase lock loops (PLLs) and general-purpose phase alignment circuits. Alternative uses are possible and within the scope of the present invention.

According to one embodiment, a circuit is provided herein for generating an output signal from a pair of complementary input signals. In particular, the circuit may include a pair of substantially identical circuit blocks, each configured for receiving one of the pair of complementary input signals. As described in more detail below, the pair of substantially identical circuit blocks may work together to generate an output signal having a programmable phase shift amount and/or programmable duty cycle ratio.

For example, a first circuit block may be included for receiving a first one of the pair of complementary input signals, generating a first linearly increasing voltage in response to a rising edge of the first input signal, and transitioning the output signal from logic LOW to logic HIGH once the first linearly increasing voltage exceeds a first adjustable reference voltage set by the first circuit block. A second circuit block, substantially identical to the first circuit block, may also be included for receiving a second one of the pair of complementary input signals, generating a second linearly increasing voltage in response to a rising edge the second input signal, and transitioning the output signal from logic HIGH to logic LOW once the second linearly increasing voltage exceeds a second adjustable reference voltage set by the second circuit block. Though specific reference is made herein to rising/falling edges and logic LOW/HIGH states, one skilled in the art will understand that such reference is relative and may be changed with simple circuit modifications.

In a more specific embodiment, the first circuit block may include a first delay sub-circuit coupled for receiving the rising edge of the first input signal and configured for generating a first discharge signal; a first storage device configured for generating the first linearly increasing voltage signal when charged; a first charging sub-circuit coupled in series with the first storage device for charging the first storage device in response to the rising edge of the first input signal; and a first discharging sub-circuit coupled in parallel to the first storage device for discharging the first storage device to ground upon receiving a second discharge signal from the second circuit block. A first programmable digitalto-analog converter (DAC) may also be included within the first circuit block for generating the first adjustable reference voltage. A first comparator, coupled to the first storage device and DAC, may be configured for transitioning the output signal from logic LOW to logic HIGH once the first linearly increasing voltage exceeds the first adjustable reference voltage.

Similar to the first circuit block, the second circuit block may include a second delay sub-circuit coupled for receiving the rising edge of the second input signal and configured for generating the second discharge signal; a second storage device configured for generating the second linearly increasing voltage signal when charged; a second charging sub-circuit coupled in series with the second storage device for charging the second storage device in response to the rising edge of the second input signal; and a second discharging sub-circuit coupled in parallel to the second storage device for discharging the second storage device to ground upon receiving the first discharge signal from the first circuit block. A second programmable digital-to-analog converter (DAC) may also be included for generating the second adjustable reference voltage. A second comparator, coupled to the second storage device and DAC, may be configured for transitioning the output signal from logic HIGH to logic LOW once the second linearly increasing voltage exceeds the second adjustable reference voltage.

According to a unique aspect of the invention, at least one of the adjustable reference voltages set by the first and second circuit blocks can be adjusted to alter a duty cycle of the output signal and/or a phase difference between the input and output signals. For example, a programmable means may be provided within the first and second circuit blocks for supplying the first and second DACs with a pair of N-bit digital words. In some cases, the number 'N' may be selected from a range of integer values between about 2 and 8 (or more). The digital words may then be converted by the DACs into analog values representing the first and second adjustable reference voltages. In some cases, the programmable means may be selected from a group of programmable devices comprising registers, counters and memory devices; however, hardwired or externally supplied bits may also be used for programming the DACs.

In some applications, the output signal can be made to attain a 50% duty cycle, if each of said means is programmed with the same N-bit digital word, thereby causing the first and second programmable DACs to generate substantially identical first and second adjustable reference voltages. However, the output signal can be made to attain a duty cycle, which is substantially greater than or less than 50%, if said means are programmed with substantially different N-bit digital words, thereby causing the first and second programmable DACs to generate substantially different first and second adjustable reference voltages.

In some cases, the phase difference between the input and output signals may be determined by a slope of the first linearly increasing voltage signal and the first adjustable reference voltage. Therefore, the phase difference may be altered by modifying the first adjustable voltage and/or changing the slope of the first linearly increasing voltage signal. In some embodiments, an adjustable capacitor may be used for implementing the first storage device, while a voltage controlled current source is used for implementing the first charging sub-circuit. In such embodiments, values associated with the capacitor and/or the current source may be adjusted for changing the slope of the first linearly increasing voltage signal, and as a result, increasing or decreasing the phase difference between the input and output signals.

According to another embodiment, a method is provided herein for generating an output signal from a pair of complementary input signals. Such a method may comprise multiple steps, some of which may include: producing a first linearly increasing voltage signal upon receiving a rising edge of a first one of the pair of complementary input signals, and generating a logic HIGH output signal once the first linearly increasing voltage signal exceeds a first adjustable reference voltage. In addition, the method may include the steps of producing a second linearly increasing voltage signal upon receiving a rising edge of a second one of the pair of complementary input signals, and generating a logic LOW output signal once the second linearly increasing voltage signal exceeds a second adjustable reference voltage.

In a preferred aspect of the invention, the method may further include setting the first and second adjustable reference voltages to control a duty cycle and phase shift amount associated with the output signal. In some cases, the step of setting may include selecting substantially identical first and second adjustable reference voltages to provide the output signal with approximately 50% duty cycle. In other cases, the step of setting may include selecting first and second adjustable reference voltages, which are substantially different from one another, to provide the output signal with a duty cycle that is substantially greater or less than 50%. In some cases, the step of setting may also include increasing/decreasing the first adjustable reference voltage to increase/decrease the phase shift amount associated with the output signal. In other cases, the phase shift amount may be adjusted by additional or alternative means. For example, the steps of producing the first and second linearly increasing voltage signals may be performed by supplying a current to a capacitive storage device. In such an example, one or more values associated with the current and the capacitive storage device may be adjusted for changing the slope of at least one of the linearly increasing voltage signals, and as a result, altering the duty cycle and/or phase shift amount associated with the output signal. In some cases, the step of adjusting may also enable a frequency of the output signal to be set equal to, or different than, the frequency of the complementary input signals.

BRIEF DESCRIPTION OF THE DRAWINGS

Other objects and advantages of the invention will become apparent upon reading the following detailed description and upon reference to the accompanying drawings in which.

Figure 1:
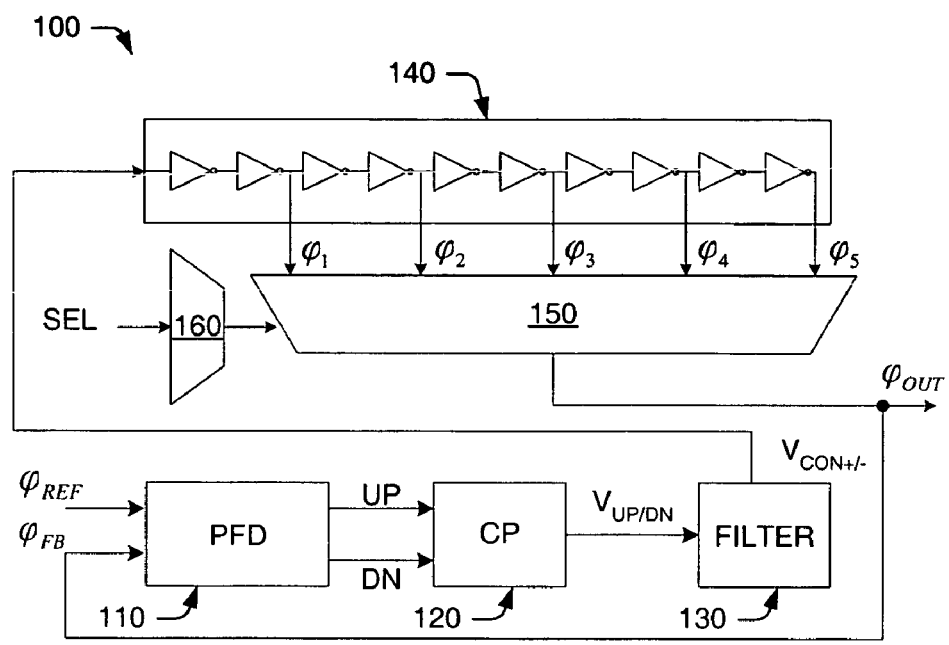
FIG. 1 is a block diagram of a conventional phase shift apparatus, which uses a delay locked loop (DLL) for generating a number of phase increments from which a phase shift amount may be selected.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
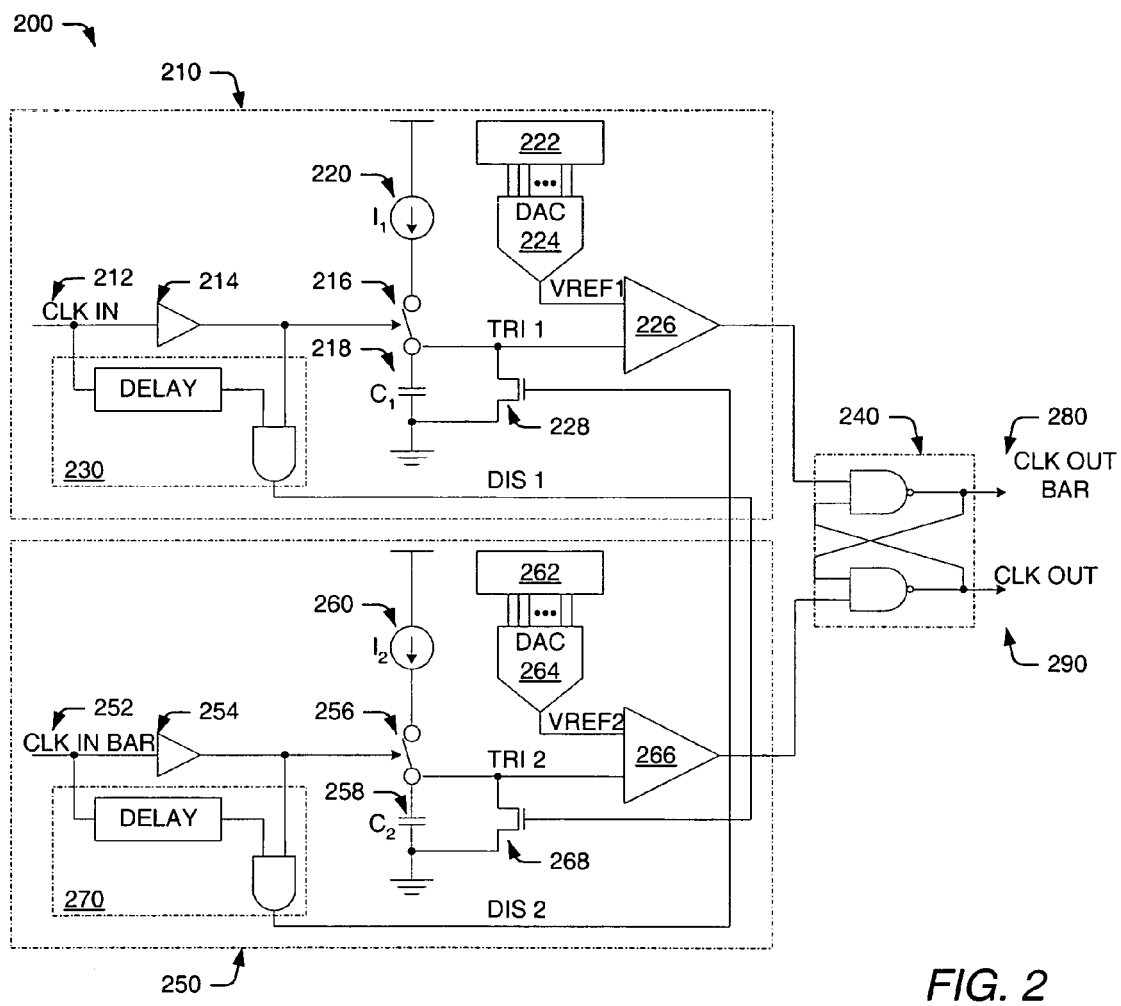
FIG. 2 is a schematic diagram of an improved phase shift and duty cycle correction circuit, according to one embodiment of the invention.

An embodiment of an improved phase shift and duty cycle correction circuit is shown in FIG. 2. In general, the improved circuit enables both rising and falling edges of a generated clock signal to be shifted in time by an independently programmable amount. In some embodiments, the programmable amounts may be set by a manufacturer or end-user of the circuit; however, additional circuit components may be provided, in other cases, for detecting and automatically setting an appropriate phase shift amount. By shifting the rising and falling edges of the clock signal, the improved circuit provides a unique means for correcting, or otherwise modifying, a duty cycle of the generated clock signal. In one embodiment, means for adjusting the phase and duty cycle of the generated clock signal may be implemented with a simple digital-to-analog converter (DAC), programmable by a variety of methods, including but not limited to, register bits, hardwired bits, externally supplied inputs, programmable memory bits and other methods.

FIG. 2 illustrates an improved phase shift and duty cycle correction circuit 200, according to one embodiment of the present invention. The normal operation of circuit 200 will be described in more detail below in reference to FIGS. 2 and 3. However, reference is made first to FIG. 2 for a description of the basic circuit structure provided by the present invention. As shown in FIG. 2, phase shift and duty cycle correction circuit 200 includes a pair of substantially identical circuit blocks 210 and 250, each configured for receiving one of a pair of differential input signals. As described in more detail below, circuit blocks 210 and 250 may work together to generate a pair of differential output signals having programmable phase shift and duty cycle amounts. Driver circuit 240 is included within circuit 200 for driving the differential output signals upon output conductors 280 and 290. In one embodiment, a simple latch circuit comprising cross-coupled NAND gates may be used to implement driver 240; however, other configurations may be possible. For example, driver circuit 240 may be implemented with NOR gates, in other embodiments of the invention.

In the example shown, input conductor 212 of circuit block 210 is configured for receiving a clock signal (labeled "CLK IN"), while input conductor 252 of circuit block 250 is configured for receiving a complementary version of the clock signal (labeled "CLK IN BAR"). As a result, phase shift and duty cycle correction circuit 200 is configured for generating a pair of differential output clock signals (labeled "CLK OUT" and "CLK OUT BAR"), which may differ in phase and/or duty cycle from the differential input clock signals supplied thereto. Though clocking signals are shown in the embodiment of FIG. 2 and described herein, circuit 200 may be alternatively configured for receiving substantially any other differential signal input.

One advantage provided by circuit 200 lies in the substantially identical structure of circuit blocks 210 and 250. In addition to simplifying design and manufacturing processes, the use of circuit blocks 210 and 250 may provide phase shift and duty cycle correction circuit 200 with a relatively compact design by reducing the number of circuit elements usually required in such circuits. Exemplary components of circuit blocks 210 are described below; however, similar reference numerals are used to designate the same or similar components found in circuit block 250.

As shown in FIG. 2, basic components of circuit block 210 include input conductor 212, switch 216, storage device 218, charge sub-circuit 220, discharge (or dump) sub-circuit 228 and comparator 226. According to a preferred embodiment of the invention, a programmable means (222, 224) may also be included within circuit block 210 for setting a comparator reference voltage (otherwise referred to as a "slicing", "switching" or "comparator threshold" voltage). As noted above, input conductor 212 may be coupled for receiving one of the differential clock signals supplied to circuit 200. The input clock signal, which may be temporarily delayed by buffer 214, is used for activating/deactivating switch 216. For example, switch 216 may be activated (i.e., turned ON) on rising edges of the input clock signal, and deactivated (i.e., turned OFF) on failing edges of the input clock signal. However, one skilled in the art will understand how the opposite may be true in other embodiments of the invention.

When turned ON, switch 216 may be closed for connecting charge sub-circuit 220 to storage device 218 and supplying a constant charging current thereto. As shown in FIG. 2, charge sub-circuit 220 is coupled between a power supply node (e.g., $V_{DD}$) and one terminal of switch 216, while storage device 218 is coupled between ground (e.g., $V_{CC}$) and the other terminal of switch 216. Charge sub-circuit 220 may be implemented with a voltage controlled current source, or any other charge pump style circuit, which is configured for supplying a controlled amount of current to storage device 218 via switch 216. In addition, storage device 218 may be implemented with a capacitor, or any other "integrator" configured for producing a linearly increasing voltage when supplied with a constant charging current. In most cases, the slope of the linearly increasing voltage may be directly proportional to the magnitude of the charging current and inversely proportional to the capacitance of the storage device. Thus, a programmable current source 220 and/or capacitor 218 may be utilized, in some embodiments, for changing the slope by altering the amount of charging current and/or capacitance, respectively.

When turned OFF, switch 216 may be opened for disconnecting current source 220 from capacitor 218. However, instead of allowing the stored voltage within capacitor 218 to slowly decay according to a preset time constant, discharge sub-circuit 228 may be activated for resetting capacitor 218 by rapidly discharging the stored voltage to a ground potential. In some cases, discharge sub-circuit 228 may include a single transistor, which is coupled in parallel to capacitor 218. According to one preferred embodiment, transistor 228 may be activated by a discharge signal (DIS 2) generated by and received from circuit block 250. Once activated, transistor 228 provides an alternative current path by which the stored voltage can be quickly discharged (or "dumped") to ground. For this reason, transistor 228 may be alternatively referred to herein as a dump sub-circuit.

Figure 3:
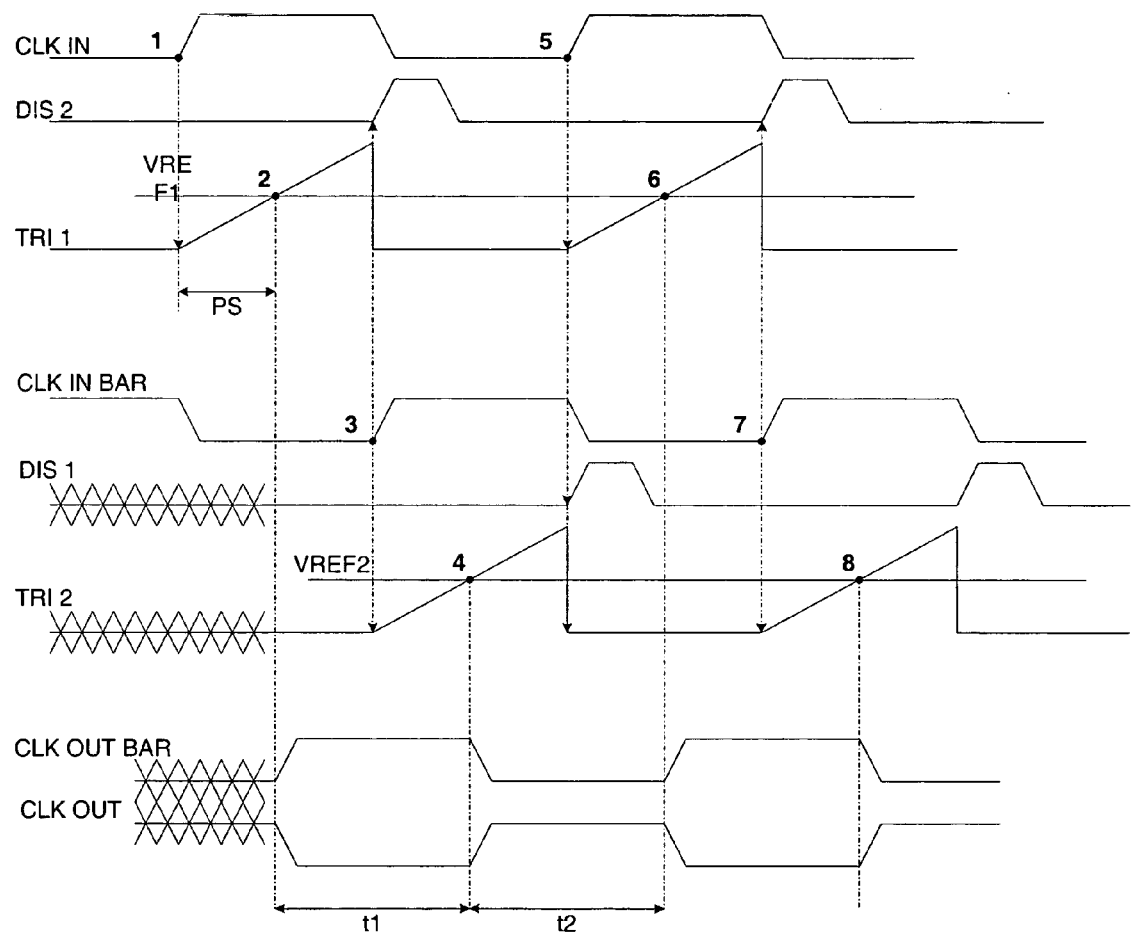
FIG. 3 is a timing diagram illustrating an exemplary operation of the improved phase shift and duty cycle correction circuit of FIG. 2.

As described in more detail below, the discharge signal (DIS 2) used for activating dump sub-circuit 228 may occur on rising edges of the complementary clock signal (CLK IN BAR) received by circuit block 250. Capacitor 218 may remain in a reset state until the next rising edge of the clock signal (CLK IN) enables current to flow into capacitor 218 (i.e., by closing switch 216), giving rise to another linearly increasing voltage. In some cases, the cycle of charging and discharging capacitor 218 may repeat at the frequency of the differential input signals, yielding a triangular (TRI 1) or saw tooth shaped waveform, as shown in FIG. 3.

Comparator 226 includes a pair of inputs for receiving the triangular waveform (TRI 1) generated by charging and discharging capacitor 218, and a reference voltage (VREF 1) for comparison therewith. The results from comparator 226 are fed directly to one input of driver circuit 240. According to a preferred embodiment of the invention, a programmable means may be included within circuit block 210 for supplying an adjustable reference voltage to comparator 226. In some embodiments, the adjustable reference voltage may be generated by supplying an external voltage to a circuit pin, or by generating the reference voltage through the use of a resistor divider network or reference voltage generation circuit (e.g., a bandgap circuit).

In a preferred embodiment (shown in FIG. 2), the programmable means for generating the adjustable reference voltage may include digital-to-analog converter (DAC) 224, and in some cases, may also include a programmable device 222 with which to control DAC 224. Exemplary programmable devices may include, but are not limited to, registers, counters, and various types of volatile and non-volatile memory (such as read-only memory, ROM, erasable programmable ROM, EPROM, random access memory, RAM, flash memory, etc). In other cases, however, DAC 224 may be controlled by hardwired bits or externally supplied inputs.

In any case, DAC 224 may be controlled by an N-bit digital word, where 'N' is selected from a range of integer values between approximately 2 and 8 (or more). The number of available reference voltages, or in other words, the resolution of the DAC, may be increased (or decreased) by selecting larger (or smaller) values of N. In some cases, for example, a 5-bit digital word may be input to the DAC for generating a reference voltage within a range of available voltages extending between about 0 and $(31/32)V_{DD}$. Though 5-bits may provide sufficient resolution in some applications, the number of bits within the digital word may be increased (or decreased) to provide more than (or fewer than) the above-mentioned range of reference voltage options. Though the DAC input may originate from a variety of sources (for example, an up-down counter), a particular source may be chosen to meet certain design considerations (e.g., DAC resolution and cost).

DAC 224 generally functions to convert the N-bit digital word into an analog value, which represents a first adjustable reference voltage (VREF 1). By providing the DAC with a programmable input, the reference voltage generated by DAC 224 may be increased or decreased for changing the amount by which the generated output signal is shifted from the differential input signal. As described in more detail below, the duty cycle of the generated output signal may also be modified by altering the first adjustable reference voltage (VREF 1) generated by DAC 224 and/or the second adjustable reference voltage (VREF 2) generated by DAC 264 of circuit block 250. In some cases, the duty cycle of the generated output signal may be corrected to maintain a substantially 50% duty cycle ratio and/or to alleviate the effects of duty cycle distortion (DCD). However, the duty cycle of the generated output signal could simply be modified, in other cases, for attaining substantially any duty cycle ratio.

For the purposes of DCD correction, the DAC input can be derived from another loop (not shown), which monitors the DC level of the generated output signal to dynamically adjust the DAC input value (e.g., an up-down counter value). For this purpose, and other applications that may benefit from dynamically derived DAC values, driver circuit 240 may include additional logic gates and/or ROM tables.

Elements of the improved phase shift and duty cycle correction circuit 200 include a current source coupled in series with a capacitor, which in one exemplary embodiment, may be a polysilicon or metal-to-metal (MIM) capacitor. In some embodiments, values associated with the current source and/or the capacitor may be adjusted for changing a slope of the linearly increasing voltage generated within capacitor 218 and/or capacitor 258. In doing so, additional means are provided for adjusting the phase difference between the input and output signals and the duty cycle of the output signal. The invention further comprises a discharging sub-circuit, which in one exemplary embodiment, may be a metal-oxide silicon (MOS) or bipolar device.

According to a preferred aspect of the invention, the duty cycle of the generated output signal may be accurately controlled by using opposite phases of the input clock to SET and RESET the capacitor voltages. For example, delay sub-circuit 230 is included within circuit block 210 for producing a first discharge signal (DIS 1) on rising edges of the input clock signal (CLK IN); the first discharge signal is supplied to transistor 268 of circuit block 250 for resetting capacitor 258. In the same manner, delay sub-circuit 270 is included within circuit block 250 for generating a second discharge signal (DIS 2) on rising edges of the complementary clock signal (CLK IN BAR) and for supplying the second discharge signal to transistor 228 of circuit block 210 for resetting capacitor 228. By using opposite phases of the input clock to SET and RESET the capacitor voltages, a unique means is provided for accurately controlling the duty cycle of the generated output signal. In some cases, delay sub-circuits 230 and 270 may each include a chain of buffers coupled to a two-input AND gate, as shown in FIG. 2, for generating a predetermined amount of delay. In other cases, however, the delay sub-circuits may be alternatively configured for detecting falling (or rising) edges of the input clock and for generating discharge signals in response thereto.

The invention further comprises a digital-to-analog converter (DAC) and a high speed comparator, which in one exemplary embodiment, may be a MOS or bipolar device. In some embodiments, the comparator may be designed with hysteresis to reduce glitch output when noise is introduced into the system from the power supply. For example, a comparator with hysteresis may be designed with two distinct threshold levels, referred to as "turn on" and "turn off" thresholds. To reduce the impact of noise, the "turn on" threshold can be set 'x' mV higher than the "turn off" threshold, where 'x' may be chosen by the circuit designer or user. In doing so, any noise spike less than the delta voltage of hysteresis (e.g., 100 mV) may be filtered for suppressing any glitch output or multi-firings of the comparator output.

The timing diagram shown in FIG. 3 shows several phases of operation of the improved circuit described herein. The first phase may be referred to as an integration phase, where during the logic HIGH phase of the input clock (CLK IN), switch 216 is turned ON for linearly charging capacitor 218 with the constant current ($I_1$) from current source 220. The first phase is denoted by a number '1' in FIG. 3. The second phase, shown as number '2' in FIG. 3, illustrates where the comparator (226) will switch as the linearly increasing voltage within the capacitor crosses the first threshold voltage (VREF 1) set by DAC 224. As shown in FIG. 3, crossing of the first threshold voltage causes a logic LOW output signal (CLK OUT) and a logic HIGH complementary output signal (CLK OUT BAR) to be generated by circuit 200. The opposite may be true in alternative embodiments of the invention.

The third phase, designated by the number '3' in FIG. 3, shows where the capacitor is discharged by the narrow pulse (DIS 2) received from the delay sub-circuit (270) of circuit block 250. The third phase also indicates the beginning of another integration phase, where during the logic LOW phase of the input clock, switch 256 is turned ON for linearly charging capacitor 258 with the constant current ($I_2$) from current source 260. Comparator 266 will switch in the fourth phase once the linearly increasing voltage within capacitor 258 crosses the second threshold voltage (VREF 2) set by DAC 264. At the switch point, circuit 200 generates a logic HIGH output signal (CLK OUT) and a logic LOW complementary output signal (CLK OUT BAR). Following the fourth phase, the cycle of charging and discharging capacitors 228 and 258 may be repeated (see phases 5, 6, 7 and 8 of FIG. 3) at the frequency of the input clock or at another frequency which may be set, for example, by the end-user.

When referring to the circuit schematic of FIG. 2 and the timing diagram of FIG. 3, one skilled in the art will recognize that the ability to program DAC 224 and 264 with adjustable N-bit control values is highly advantageous. For example, by programming the DACs, the generated reference voltages may be adjusted with relatively small to relatively large phase increments, where a particular phase increment may be chosen to satisfy the needs of a particular application. In some cases, a large phase increment may be sufficient for data setup and hold time adjustments in a digital system, whereas smaller phase increments may be used for adjusting the duty cycle of the digital system.

Another advantage provided by circuit 200 is that the first and second reference voltages generated by DACs 224 and 264 may be set independent from one another. For example, the first reference voltage (VREF 1) may be set for attaining a particular phase shift (PS) difference between the input and output signals, whereas the second reference voltage (VREF 2) may be adjusted to attain a particular duty cycle. In some cases, the output signal can be made to attain a 50% duty cycle, if substantially identical N-bit digital words are supplied to DACs 224 and 264 for generating substantially equal reference voltages (e.g., VREF 1=VREF 2). However, the output signal may attain a duty cycle, which is substantially greater than or less than 50%, when substantially different N-bit digital words are supplied to the DACs for generating substantially different reference voltages (e.g., VREF 1≠VREF 2).

In some instances, the "duty cycle" of a signal may be described as the ratio of high time (i.e., the time over which the signal is high) to the overall period of the signal. As shown in FIG. 3, for example, the duty cycle of the differential output signals (CLK OUT and CLK OUT BAR) may be substantially equal to $t_1/(t_1+t_2)$, where $t_1$ is the high time and $(t_1+t_2)$ is the period of the CLK OUT signal. Though duty cycle specifications are often application-specific, desirable duty cycle values may range between about ±2–5% of 50%. By programmably adjusting the values of VREF 1 and VREF 2, the duty cycle of the output signals can be modified by increasing or decreasing the output signal "high time" relative to the output signal period. Therefore, phase shift and duty cycle correction circuit 200 may be used, in some cases, for correcting duty cycle distortion that may occur when a clock path imparts inconsistent amounts of delay to the rising and falling edges of the differential input signals. On the other hand, circuit 200 may simply be used for generating a pair of differential output signals having substantially any duty cycle ratio.

Additional advantages of the improved circuit include frequency independence and an open loop operation, which is free from stability problems. For example, a frequency of the differential output signals may be changed by modifying a slope of at least one of the linearly increasing voltage signals (TRI 1 and TRI 2). In some embodiments, the slope of the linearly increasing voltage signals may be increased by increasing the constant current ($I_1$ or $I_2$) and/or decreasing the capacitance ($C_1$ or $C_2$). The opposite may be applied for decreasing the slope of the linearly increasing voltage signals. In some cases, the slope may also be increased (or decreased) for increasing (or decreasing) the frequency of the generated output signal. The frequency independence of circuit 200, therefore, provides a unique advantage over PLL/DLL-based phase shift circuits, which are carefully designed for operating within a particular frequency range. By adopting an open loop configuration, circuit 200 avoids the stability issues that plague most PLL/DLL-based phase shift circuits.

In addition, the improved circuit provides a highly flexible means for performing phase alignment and duty cycle correction by allowing I, C and VREF to each be set with programmable values. Furthermore, the resolution of the DAC may be adjusted to tailor the phase shift operation to a wide variety of applications by providing relatively small to relatively large phase increments. The improved circuit is also relatively compact. In other words, the improved circuit consumes relatively little die area and can be implemented, e.g., under or between pads on a semiconductor die. Another advantage is that the improved circuit can be implemented in bipolar technology, as well as metal oxide silicon (MOS) technology.

A further advantage of the improved circuit is that it may be used to improve data/clock interface timing by programming a clock phase in relation to a data phase. In some cases, for example, circuit 200 may be used to impart an adjustable amount of delay to a clock path, so that a transition of the clock signal may be aligned with a transition of the data signal. In other cases, a clock signal transition may be shifted by circuit 200 for changing the set-up and hold times of an associated data signal. In other words, circuit 200 may shift the clock signal transition sufficiently in time, so that it may sample a data signal at the proper point (e.g., in the middle of the data pulse).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof, for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit configured for generating an output signal in response to an input signal, the circuit comprising:
   a storage device configured for generating a linearly increasing voltage signal when charged;
   series-coupled current source and switch further coupled in series with the storage device for charging the storage device when the switch is closed;
   a programmable digital-to-analog converter (DAC) configured for generating an adjustable reference voltage;
   a comparator having a pair of inputs, one coupled to the storage device and one to the programmable DAC, wherein the comparator is configured for transitioning the output signal from logic LOW to logic HIGH once the linearly increasing voltage exceeds the adjustable reference voltage, and wherein a phase difference between the input and output signals is determined, at least in part, by the adjustable reference voltage; and
   a delay sub-circuit coupled for receiving the input signal and configured for generating a discharge signal on each rising edge of the input signal.

2. The circuit as recited in claim 1, wherein the storage device comprises a capacitor.

3. The circuit as recited in claim 2, wherein values associated with the capacitor and/or the current source can be adjusted for changing a slope of the linearly increasing voltage signal, and as a result, increasing or decreasing the phase difference between the input and output signals.

4. The circuit as recited in claim 2, further comprising a storage means coupled to the programmable DAC for supplying an N-bit digital word thereto, wherein the number 'N' is selected from a range of integer values between about 2 and 8, and wherein the digital word is converted by the programmable DAC into an analog value representative of the adjustable reference voltage.

5. The circuit as recited in claim 4, wherein said storage means is selected from a group of programmable devices comprising registers, counters and memory devices.

6. The circuit as recited in claim 4, further comprising a discharging sub-circuit coupled in parallel to the storage device for discharging the storage device to ground upon receiving a second discharge signal.

7. The circuit as recited in claim 6, wherein the discharging sub-circuit comprises a transistor, which when activated by the second discharge signal, resets the storage device to a ground potential.

8. The circuit as recited in claim 7, wherein the second discharge signal is generated in response to a rising edge of a complementary input signal, which is received by a second circuit substantially identical to the circuit.

9. The circuit as recited in claim 8, wherein the second circuit comprises:
   a second delay sub-circuit coupled for receiving the complementary input signal and configured for generating the second discharge signal on each rising edge of the complementary input signal;
   a second storage device configured for generating a second linearly increasing voltage signal when charged;
   a second charging sub-circuit coupled in series with the second storage device for charging the second storage device in response to the rising edge of the complementary input signal;
   a second discharging sub-circuit coupled in parallel to the second storage device for discharging the second storage device to ground upon receiving the first discharge signal from the first delay sub-circuit;
   a second programmable digital-to-analog converter (DAC) configured for generating a second adjustable reference voltage; and
   a second comparator having a pair of inputs, one coupled to the second storage device and one to the second programmable DAC, wherein the second comparator is configured for transitioning the output signal from logic HIGH to logic LOW once the second linearly increasing voltage exceeds the second adjustable reference voltage.

10. A circuit configured for generating an output signal from a pair of complementary input signals, the circuit comprising:
    a first circuit block coupled for receiving a first one of the pair of complementary input signals, generating a first linearly increasing voltage in response to a rising edge of the first input signal, and transitioning the output signal from logic LOW to logic HIGH once the first linearly increasing voltage exceeds a first adjustable reference voltage set by the first circuit block;
    a second circuit block, substantially identical to the first circuit block, wherein the second circuit block is coupled for receiving a second one of the pair of complementary input signals, generating a second linearly increasing voltage in response to a rising edge the second input signal, and transitioning the output signal from logic HIGH to logic LOW once the second linearly increasing voltage exceeds a second adjustable reference voltage set by the second circuit block; and
    wherein at least one of the adjustable reference voltages set by the first and second circuit blocks can be adjusted to alter a duty cycle of the output signal and/or a phase difference between the input and output signals.

11. The circuit as recited in claim 10, wherein the first circuit block comprises:
    a first delay sub-circuit coupled for receiving the rising edge of the first input signal and configured for generating a first discharge signal;
    a first storage device configured for generating the first linearly increasing voltage signal when charged;
    a first charging sub-circuit coupled in series with the first storage device for charging the first storage device in response to the rising edge of the first input signal;
    a first discharging sub-circuit coupled in parallel to the first storage device for discharging the first storage device to ground upon receiving a second discharge signal from the second circuit block;
    a first programmable digital-to-analog converter (DAC) configured for generating the first adjustable reference voltage; and
    a first comparator having a pair of inputs, one coupled to the first storage device and one to the first programmable DAC, wherein the first comparator is configured for transitioning the output signal from logic LOW to logic HIGH once the first linearly increasing voltage exceeds the first adjustable reference voltage.

12. The circuit as recited in claim 11, wherein the second circuit block comprises:

a second delay sub-circuit coupled for receiving the rising edge of the second input signal and configured for generating the second discharge signal;

a second storage device configured for generating the second linearly increasing voltage signal when charged;

a second charging sub-circuit coupled in series with the second storage device for charging the second storage device in response to the rising edge of the second input signal;

a second discharging sub-circuit coupled in parallel to the second storage device for discharging the second storage device to ground upon receiving the first discharge signal from the first circuit block;

a second programmable digital-to-analog converter (DAC) configured for generating the second adjustable reference voltage; and a second comparator having a pair of inputs, one coupled to the second storage device and one to the second programmable DAC, wherein the second comparator is configured for transitioning the output signal from logic HIGH to logic LOW once the second linearly increasing voltage exceeds the second adjustable reference voltage.

13. The circuit as recited in claim 12, wherein the first and second circuit blocks each comprise a means for supplying the first and second programmable DACs with a pair of N-bit digital words associated with the first and second adjustable reference voltages.

14. The circuit as recited in claim 13, wherein said means is selected from a group of programmable devices comprising registers, counters and memory devices.

15. The circuit as recited in claim 13, wherein the output signal can be set to attain a 50% duty cycle, if each of said means is programmed with the same N-bit digital word, thereby causing the first and second programmable DACs to generate substantially identical first and second adjustable reference voltages.

16. The circuit as recited in claim 13, wherein the output signal can be set to attain a duty cycle, which is substantially greater than or less than 50%, if said means are programmed with substantially different N-bit digital words, thereby causing the first and second programmable DACs to generate substantially different first and second adjustable reference voltages.

17. The circuit as recited in claim 13, wherein the phase difference between the input and output signals is determined by a slope of the first linearly increasing voltage signal and the first adjustable reference voltage.

18. The circuit as recited in claim 17, wherein the first storage device comprises a capacitor, wherein the first charging sub-circuit comprises a current source, and wherein values associated with the capacitor and/or the current source can be adjusted for changing the slope of the first linearly increasing voltage signal, and as a result, increasing or decreasing the phase difference between the input and output signals.

19. A method for generating an output signal from a pair of complementary input signals, the method comprising:

producing a first linearly increasing voltage signal upon receiving a rising edge of a first one of the pair of complementary input signals;

generating a logic HIGH output signal once the first linearly increasing voltage signal exceeds a first adjustable reference voltage;

producing a second linearly increasing voltage signal upon receiving a rising edge of a second one of the pair of complementary input signals;

generating a logic LOW output signal once the second linearly increasing voltage signal exceeds a second adjustable reference voltage; and setting the first and second adjustable reference voltages to control a duty cycle and phase shift amount associated with the output signal.

20. The method as recited in claim 19, wherein the step of setting comprises selecting substantially identical first and second adjustable reference voltages to provide the output signal with approximately 50% duty cycle.

21. The method as recited in claim 19, wherein the step of setting comprises selecting first and second adjustable reference voltages, which are substantially different from one another, to provide the output signal with a duty cycle that is substantially greater or less than 50%.

22. The method as recited in claim 19, wherein the step of setting comprises increasing/decreasing the first adjustable reference voltage to increase/decrease the phase shift amount associated with the output signal.

23. The method as recited in claim 19, wherein the steps of producing the first and second linearly increasing voltage signals each comprise supplying a current to a capacitive storage device.

24. The method as recited in claim 23, further comprising adjusting one or more values associated with the current and the capacitive storage device for changing the slope of at least one of the linearly increasing voltage signals, and as a result, altering the duty cycle and/or phase shift amount associated with the output signal.

25. The method as recited in claim 24, wherein the step of adjusting also enables a frequency of the output signal to be set equal to, or different than, a frequency of the complementary input signals.

* * * * *